Aug. 7, 1956 P. E. LANNAN ET AL 2,758,209
SIGNAL GENERATOR SYSTEM AND APPARATUS
Filed Dec. 11, 1953 4 Sheets-Sheet 1

INVENTORS
PATRICK E. LANNAN
MARION L. SNEDEKER
BY Hudson, Boughton, Williams, David & Hoffmann
ATTORNEYS INVENTORS
PATRICK E. LANNAN
BY MARION L. SNEDEKER
Hudson, Boughton,
Williams, David & Hoffmann
ATTORNEYS

SIGNAL GENERATOR SYSTEM AND APPARATUS

Filed Dec. 11, 1953 4 Sheets-Sheet 3

INVENTORS
PATRICK E. LANNAN
MARION L. SHEDEKER
BY Hudson, Boughton,
Williams, David & Hoffmann
ATTORNEYS INVENTORS
PATRICK E. LANNAN
BY MARION L. SNEDEKER
Hudson, Boughton,
Williams, David & Hoffmann
ATTORNEYS 2,758,209

SIGNAL GENERATOR SYSTEM AND APPARATUS

Patrick E. Lannan and Marion L. Snedeker, Cleveland, Ohio, assignors to Designers for Industry, Inc., Cleveland, Ohio, a corporation of Ohio Application December 11, 1953, Serial No. 397,638

17 Claims. (Cl. 250—36)

The present invention relates to signal generators and, more particularly, to signal generators suitable for generating electrical signals of frequencies between 30 mc. and 1000 mc.

The principal object of the present invention is the provision of a new and improved signal generator which is continuously tunable through a wide range of frequencies in the very high and ultra high frequency ranges.

Another object of the present invention is the provision of a new and improved signal generator comprising an oscillator having a small compact tuning element comprised of a transmission line selectively operable as a ¼ wavelength or ¾ wavelength line whereby the signal generator may be tuned through a wide range of frequencies.

A further object of the present invention is the provision of a new and improved electrical oscillator which utilizes a coiled transmission line of variable electrical length selectively operable as a ¼ wavelength or ¾ wavelength line as its tuning element whereby the oscillator is tunable through a wide range of frequencies but yet is sufficiently small and compact to allow the oscillator to be used in a portable signal generator for testing various devices, particularly television sets.

Other objects and advantages of the invention will be apparent from the following detailed description of a preferred form of the invention, reference being made to the accompanying drawings forming a part hereof and wherein.

The present invention contemplates a new and improved signal generator utilizing a coiled parallel wire transmission line of variable length and selectively operable as a ¼ wavelength or ¾ wavelength line as the tuning element for the oscillator whereby the signal generator is capable of being tuned through a wide range of frequencies.

Figure 1:
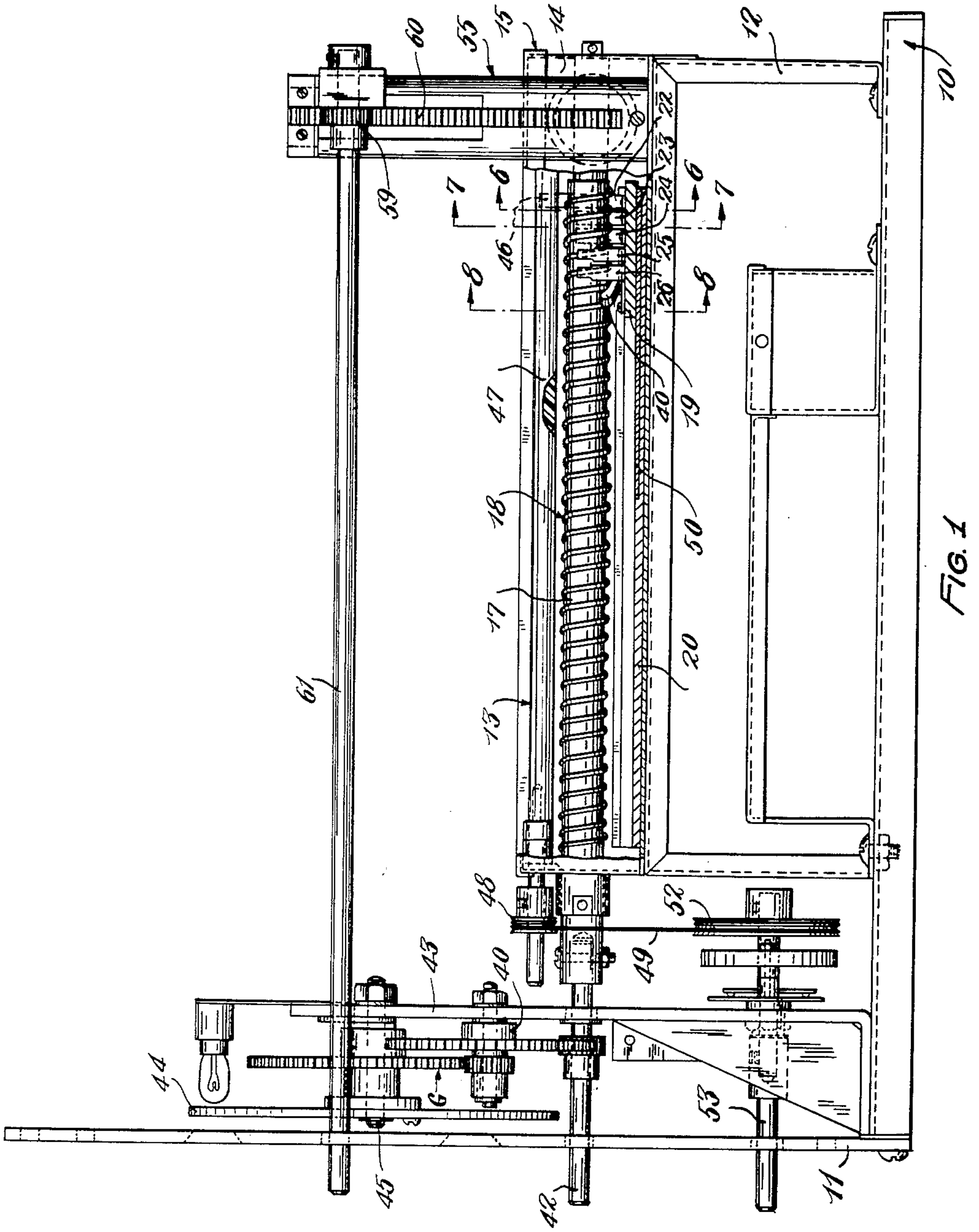
Fig. 1 is a side elevational view of the chassis of the signal generator showing the tuning element for the oscillator and the operating controls for the signal generator.
Figure 2:
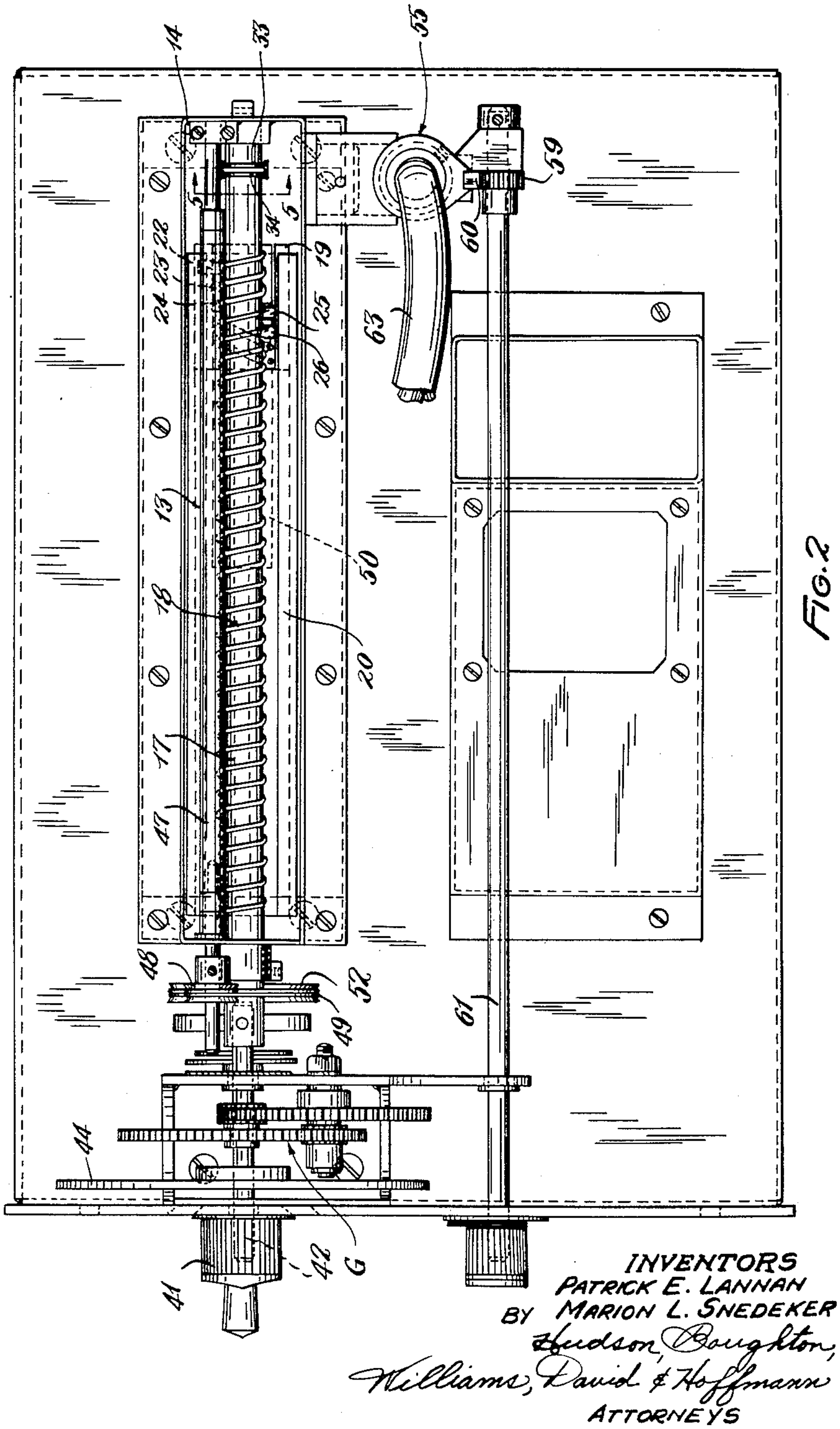
Fig. 2 is a plan view of the chassis of the signal generator shown in Fig. 1.
Figure 6:
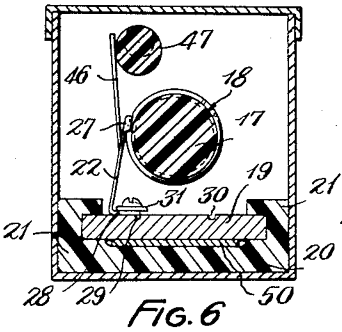
Fig. 6 is a sectional view taken approximately along line 6—6 of Fig. 4.
Figure 7:
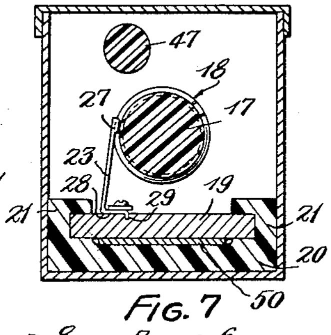
Fig. 7 is a sectional view taken approximately along line 7—7 of Fig. 4.
Figure 8:
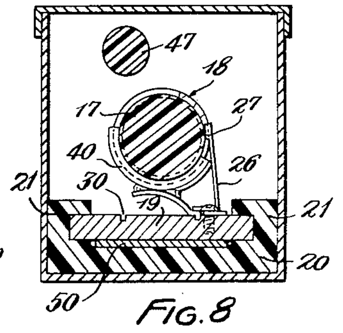
Fig. 8 is a sectional view taken approximately along line 8—8 of Fig. 4.
Figure 5:
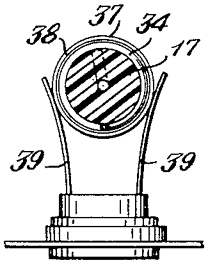
Fig. 5 is a sectional view taken approximately along line 5—5 of Fig. 4.
Figure 4:
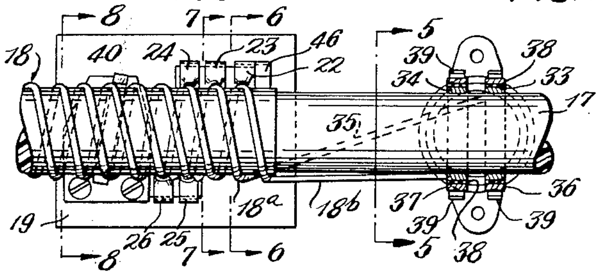
Fig. 4 is a fragmentary plan view of the wound transmission line and its associated slider used as the tuning element for the oscillator of the signal generator.
Figure 3:
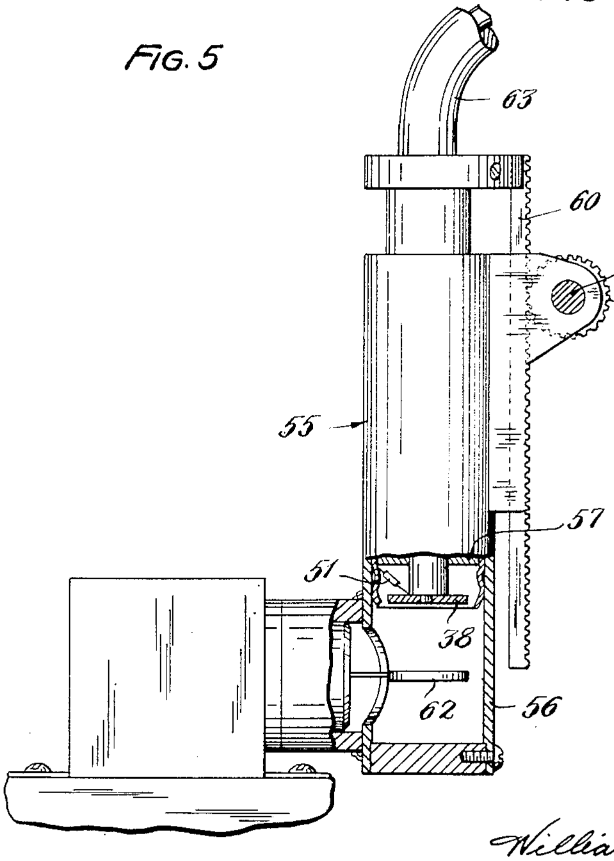
Fig. 3 is a fragmentary view partly cut away showing the variable attenuator used with the signal generator.
Figure 9:
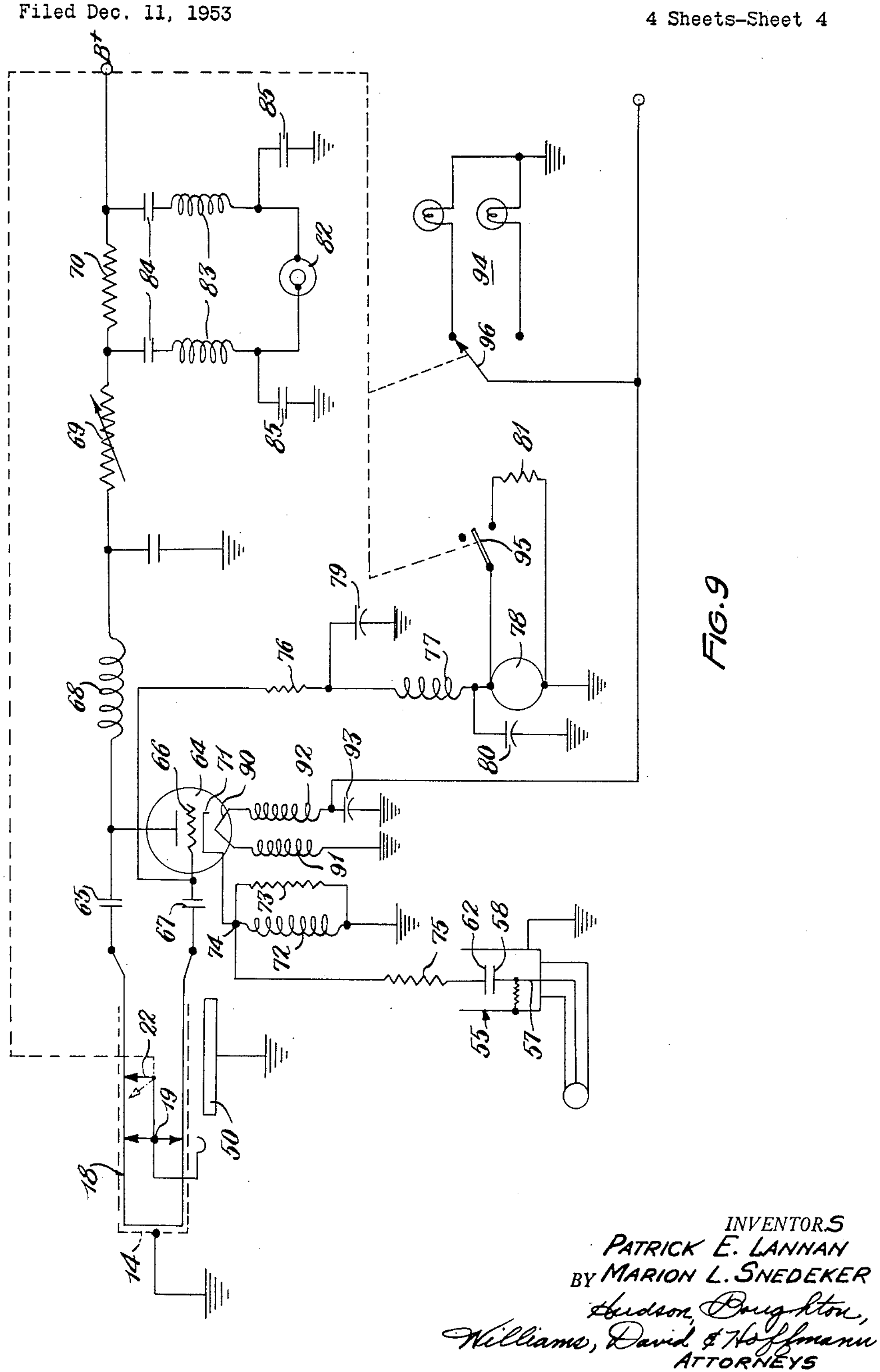
Fig. 9 is a schematic electrical diagram of a signal generator embodying the present invention.

Referring to the drawings, the signal generator generally comprises a chassis 10 for supporting the components of the signal generator including the oscillator components and having a front panel 11 extending upwardly from the forward end thereof and a raised platform 12 for supporting a tuning element 13 for the oscillator, which element is located within an oblong shield or box 14 having a cover 15. The circuit components for the oscillator, which are shown in Fig. 9 but not elsewhere in the drawings, may be mounted on the chassis in any suitable manner.

The tuning element 13 comprises a rotor 17 of nonconducting material journaled in the ends of the box 14; a parallel wire transmission line 18 with opposite sides formed by wires 18*a*, 18*b* respectively and wound, preferably in the form of a double threaded helix, on the rotor 17; and a metallic slider 19 mounted below the rotor 17 for shorting one end of the line. The parallel wire transmission line 18 is uninsulated and is so wound on the rotor that the adjacent convolutions of the line are formed by wires constituting the opposite sides of the line. The slider 19 is slidably mounted in a channel block 20 located beneath the rotor 17 for movement longitudinally with respect to the rotor. The channel block has spaced parallel side walls 21 which extend upwardly and then inwardly to form a channel adapted to receive the slider 19. The slider 19 is provided with a plurality of spring fingers 22, 23, 24, 25 and 26, adapted to engage successive convolutions of the coiled parallel wire transmission line for electrically terminating the line at one end. The fingers are each mounted on, and electrically connected to, the slider 19, three of the fingers being located on one side of the rotor 17 and two of the fingers on the other side. The outer end of each finger is provided with a nib 27 which is concave on its side adjacent the rotor 17 and engages the wire of the parallel wire transmission line.

The lower portion of each finger is bent to define an acute angle with leg portion to provide a base portion 28 including a depending portion 29. The included angle of each finger is such as to provide spring bias for urging the nibs 27 into contact with the transmission line. The depending portion 29 is received by one of two spaced parallel grooves 30 running lengthwise of the slider 19. The fingers 22, 23, 24, are tied together and clamped in place by a conductive strap 31 fixed to the slider 19 and engaging the top of the base portions 28. The fingers 25 and 26 are similarly secured by a second strap.

The fingers suitably engage successive convolutions of the transmission line. The fingers 23 and 24 engage the wires 18*a*, 18*b* respectively of the transmission line at points which are equidistant from the open end of the line, thereby providing a short-circuit between these points and a shorted transmission line balanced to ground. The fingers 22, 24 engage the wire 18*b* of the transmission line but finger 22 contacts a point closer to the open end of the line than finger 24 so that when it is engaged the short caused by fingers 22, 23 causes the transmission line to function as an unbalanced line. The fingers 25 and 26 are provided to back the short-circuit caused by the finger 23 and the finger 22 or the finger 24 and lends stability to the use of the transmission line as a tuning element. Additional backing fingers may be used if so desired.

The open end of the parallel wire transmission line is connected to spaced conductive rings 33, 34 mounted on the rotor 17 near the rearward end of the chassis. The wire 18*a* of the transmission line engaged by finger 23 is connected to the farther ring 33 and the side 18*b* engaged by the fingers 22, 24 is connected to the ring 34. In order to enable the wire 18*a* to be connected to ring 33 without making electrical contact with the other wire or with the ring 34, the rotor 17 is drilled to provide a passage 35 for the wire 18*a*. Rings 36, 37 concentric with the rings 33, 34 respectively and separated therefrom by a dielectric material 38 provide means for making external connection to the transmission line. The dielectric material 38 may be any suitable dielectric so that the concentric rings function as a blocking condenser. Each ring 36, 37 is engaged by two brushes 39 located on opposite sides of the rotor 17. The external conections to the line are made to the brushes.

The slider 19 is provided with an arcuate driver 40 which is adapted to be fit between the adjacent convolutions of the transmission line. The driver 40 is supported on the slider 19 so that it is located between convolutions of the transmission line shorted by the spring fingers. As the rotor 17 is rotated the transmission line acts as a lead screw and causes the driver 40 to move the slider 19 along the convolutions of the transmission line varying the distance of the shorting fingers from the open end of the line. If desired the nibs 27 on the fingers could be so constructed as to furnish the driving power for the slider as the rotor is rotated. In order to assure that the convolutions of the transmission line do not shift, the rotor 17 is preferably grooved and the convolutions recessed therein.

The wave length at which the transmission line is resonant is affected by the position of the slider, the diameter of the rotor, the spacing between the parallel wires, and the pitch of the windings of the transmission line. The rotor may be rotated to vary the position of the slider and the resonant frequency of the line by turning a knob 41 located on the end of a shaft 42. The shaft 42 is coaxial with the rotor 17, is fixed to one end thereof, and extends outwardly therefrom through a vertical support plate 43 and the front panel 11. The vertical support plate is intermediate to the platform 12 and the front panel 11. The position of the slider and consequently the frequency of the signal generator may be indicated by an indicator disk 44 mounted on a shaft 45 journaled in the vertical support plate 43. The shaft 45 for the indicator is geared to the shaft 40 for rotating the rotor 17 through gearing G so that the indicator disk 44 is rotated with the rotor 17.

The finger 22 is provided with a vertically extending lever 46 adapted to bear upon a cam rod 47 of nonconducting material journaled between the ends of the box 14. The forward end of the cam rod 47 extends through the end of the box 14 and is provided with a pulley 48 adapted to accommodate a drive cord 49 for rotating the cam. Rotation of the cam rod 47 will cause the finger 22 to be moved out of contact with the transmission line 18. When the finger 22 is out of contact with the transmission line, the line is formed by equal lengths of wires 18*a*, 18*b* and functions in the ¼ wave length mode. The transmission line in this case may be said to operate as a balanced line. When the cam 47 is moved to allow the finger 22 to contact the transmission line, unequal lengths of wires 18*a*, 18*b* form the opposite sides of the line and it functions in the ¾ wave length mode.

The provision of means to change the mode of operation of the transmission line increases the range of tuning element 13 since the same length of line is used to obtain two frequencies. When the line is operating as a ¾ wave length line the frequency of oscillation is higher than when the line is operating in the ¼ wave length mode. The slider 19 preferably engages a ground member or plate 50 recessed in the channel block 20 underneath the slider 19 for that portion of the line which is to operate in the ¾ wave length mode. In the illustrated embodiment the slider engages the plate for that portion of its travel which occurs intermediate the open end of the line and approximately the midpoint of the parallel wire transmission line.

The drive cord 49 for rotating the cam 47 is wound on a driving pulley 52 fixed to a shaft 53 journaled in the vertical support plate 43 and extending through the front panel 11. Rotation of the shaft 53 changes the mode of operation of the transmission line and the operating range of the generator.

The output of the oscillator of the signal generator is connected to a variable attenuator 55 mounted on the side of box 14 near the rearward end thereof. The attenuator comprises a grounded tube 56 in which a conductive plunger 57 is adapted to operate. The plunger 57 has a circular conductive member 58 fixed to its lower end and the plunger is supported for axial movement within the tube 56. The plunger is moved by a pinion 59 which meshes with a rack 60 supported dependingly from the upper end of the plunger 57. The pinion 59 may be rotated by turning shaft 61 which is journaled in the vertical support plate 43 and extends through the front panel 11. As the plunger 57 is moved up and down in the tube 56, the distance between the circular member 58 and a conductive disk 62 located below the plunger within the tube 56 and connected to the output of the signal generator is increased or decreased to vary the coupling of the attenuator. A coaxial cable 63 is connected to the plunger 57 and leads to the output terminals of the signal generator. The inner conductor of the coaxial cable terminates in the disc 58 and the outer conductor is connected to the plunger 57 making the tube part of the outer coaxial conductor. An impedance matching resistor 51 may be effectively connected between the inner and outer conductors of coaxial cable 63.

Although the tuning element described above may be used with various types of oscillators it is especially suitable for use with the oscillator shown schematically in Fig. 9. One side of the open end of the transmission line 18 is connected to the plate or anode of a vacuum tube triode 64 through the condenser 65 formed by one set of the concentric rings mounted near the rearward end of rotor 17. The open end of the other side of the transmission line 18 is connected to the control element or grid 66 of the triode 64 through the condenser 67 formed by the other set of rings. The plate of the triode 64 is also connected to the B+ terminal of the power supply through an inductance 68, a variable resistance 69 and a resistance 70 connected in series, the inductance 68 having one side connected to the plate and the other side connected to one terminal of the resistance 69. The cathode 71 of the triode is connected to ground through a load impedance which comprises an inductance 72 and a resistance 73 connected in parallel with the inductance 72. The output terminal 74 of the oscillator is connected between the cathode and the load impedance. The terminal is connected to the circular conductor member 62 of the capacity attenuator 55 through a resistance 75. The grid 66 is connected to ground through a resistor 76, a radio frequency choke 77 and a meter 78. Bypass condensers 79, 80 provide for the elimination of undesired alternating current.

The meter 78 is of the ammeter type and indicates the amount of grid current which flows in the tube. The amount of grid current is a measure of the potential at the point 74 which determines input to the attenuator 55. In testing various types of circuits it is desirable to have a constant input to the attenuator so that a particular position of the variable attenuator will always give a certain output. By adjusting the variable resistor 69 so that the meter 78 is always at a particular position, the input to the variable attenuator will be the same. In order to enable the meter 78 to operate throughout the range of the oscillator it may be shunted by a resistor 81 by means of a switch which is ganged with the finger 22 of the tuning element 13 so that the range of the meter will be changed when the position of finger 22 is changed to cause the oscillator to operate in a different range. A coaxial jack 82 may be used for the introduction of the modulating voltage, one lead from the jack being connected to one side of the resistor and the other lead being connected to the other end of the resistor. To attenuate undesired voltages, each lead from the jack includes a series connected inductance 83 and capacitor 84 with one side of the capacitor being connected to the end of resistor 70 and one side of the inductance being connected directly to the jack 82. The side of the inductance connected to the jack 82 is also connected to ground by a by-pass capacitor 85.

The power supply for the filament 90 of the triode 64 may be from a conventional power supply. The filament connections are provided with radio frequency choke coils 91, 92 to present a high impedance to any radio frequency energy coupled to the filament connections through the interelectrode capacity of the vacuum tube 64. One of the leads of choke coil 91 is connected directly to ground while one of the leads of choke coil 92 is connected to the high side of the filament voltage supply. A condenser 93 may be connected between the filament lead connected to the power supply and ground to place the filament leg at R. F. ground potential. If desired, pilot lights 94 may be provided for indicating the range of operation of the signal generator and the power connections therefor may be made to the power supply for the filament as indicated in the drawing. The pilot lights and their connections form no part of the present invention and therefore have not been described in detail. Suffice it to say that the finger 22 may be ganged with the switch 96 for the pilot lights so that the engagement or the disengagement of the finger 22 to change the range of the signal generator will be indicated by the pilot light.

The frequency of oscillation of the oscillator is determined by the distributed capacity and inductance of the transmission line 18, the distributed capacity and inductance being in turn determined by the size of the rotor, the spacing between the opposite sides of the parallel wire transmission line, the pitch of the convolutions of the line and the position of the slider 19 along, and its electrical connection to, the line. For any given tuning element the factors will remain constant except the position of the slider and whether or not the line is operating with equal or unequal lengths of wires **18*a*, 18*b*** in the circuit with a grounded or ungrounded slider.

When the transmission line is operating with unequal lengths of wires **18*a*, 18*b* in the circuit the frequency of oscillation will be that frequency whose wave length is ¼ the effective wave length of the transmission line. The term "effective length" is used because the actual physical length of the transmission line external to the tube will be shorter than a corresponding straight quarter wave length line in free space. This is due in part to the "foreshortening" of the line by such factors as the lead length inside the tube and the inherent capacity of the tube as will be well understood by those skilled in the art. When the line is operating with equal lengths of wires 18*a*, 18*b* the frequency of oscillation of the generator will be that frequency having a wave length equal to ¾ the effective length of the transmission line. The frequency of the generated oscillations will be the highest when the length of the line is a minimum; and will be the lowest when the slider 19** is in such a position that all or nearly all the wire of the helix is in the circuit. The upper frequency is limited by the lead length and the capacitance of the vacuum tube employed in the oscillator circuit. The lowest frequency is limited only by the length of the wire of the helix forming the transmission line.

A highly satisfactory tuning element for use with the oscillator described above and having circuit elements as set out below is one which has a wound, parallel wire transmission line wherein the opposite sides of the line are spaced approximately one-eighth inch apart and the convolutions have a pitch of approximately one-quarter inch, the line being wound on a rotor of about one-half inch diameter and having an overall wound length of approximately eight inches. The circuit elements of the illustrated oscillator have preferably the following values:

| | |
|---|---|
| Inductance **68** | 1.0 micro-henry. |
| Resistance **69** | 750 ohms. |
| Resistance **70** | Maximum of 10,000 ohms. |
| Inductance **72** | 20 micro-henries. |
| Resistance **73** | 3900 ohms. |
| Resistance **75** | 100 ohms. |
| Resistance **76** | 15,000 ohms. |

The tube is preferably a 6AF4 triode, the B+ power supply 150 v., and the resistance between the circular conducting member of the variable attenuator and its grounded tube 56 is preferably approximately 56 ohms. The specific values and dimensions of the oscillator and the tuning element respectively have been given for purposes of illustration and do not measure the scope of the present invention. It may be stated, however, that the described embodiment provides an oscillator having a great range of frequencies, one range beginning at approximately 300 mc. and limited by the vacuum tube of the oscillator, when the line is operating in the ¾ wave length mode, and another range beginning at approximately 350 mc. as the upper limit and limited by the length of the transmission line when the line is operating in the ¼ wave length mode.

The description of the preferred embodiment including the transmission line tuning element has been made with reference to the specific structure disclosed, it being understood that equivalent means may be substituted for the various parts and components shown without departing from the scope of the present invention. For example, the parallel wire transmission line may be formed by a pair of any suitable conducting members adapted to function in the manner of the wires **18*a*, 18*b*** and the terminating means for the line may include circuit elements such as a capacitor as will be well understood by those skilled in the art.

It can now be seen that the above described invention provides a new and improved signal generator which is tunable through a wide range of high frequencies. Although we have described a preferred form of the invention it is understood that other forms, modifications and adaptations could be adopted without departing from the scope of the claims hereof.

Having thus described our invention, we claim:

1. A signal generator comprising an oscillator for producing an electrical signal including a vacuum tube having an anode, a cathode, and a control element; a tuned circuit electrically connected to said device for determining the frequency of oscillation comprising a pair of wires constituting the opposite sides of a parallel wire transmission line open at one end, and short-circuiting means movable along the said line for terminating said line including means to electrically operate said line with equal lengths of said wires forming the opposite sides of said line whereby said line is adapted to function in the ¼ wave length mode and means to electrically operate said line with unequal lengths of said wires forming the opposite sides of said line whereby said line is adapted to function in the ¾ wave length mode.

2. A signal generator comprising an oscillator for producing an electrical signal including a vacuum tube having an anode, a cathode, and a control element; and tuning means connected to said tube for controlling the frequency of oscillation of said oscillator comprising a member of nonconducting material, a pair of wires helically coiled on said member with the adjacent convolutions of the coil being formed by different wires, said wires constituting the opposite sides of a parallel wire transmission line open at one end, short-circuiting means movable along the convolutions of said coil for electrically terminating said line including a pair of fingers for engaging the opposite sides of said line to terminate said line with opposite sides of equal length whereby said line is adapted to function as a ¼ wave length line, and a third finger connected to said pair of fingers and engaging one side of said line for terminating said line with opposite sides of unequal length, whereby said line is adapted to selectively function as a ¾ wave length line.

3. A signal generator comprising an oscillator for producing an electrical signal including a vacuum tube having an anode, a cathode, and a control element; and tuning means for said device comprising a member of non-conducting material, a parallel wire transmission line coiled on said rotor with the adjacent convolutions of the coil being formed by opposite sides of the line, short-circuiting means movable along the convolutions of said coil for electrically terminating said line including means for electrically operating said line with opposite sides of equal length whereby said line is adapted to function in the ¼ wave length mode, and means for electrically operating said line with opposite sides of unequal lengths whereby said line is adapted to function in the ¾ wave length mode, and means for grounding the last-said means for at least a portion of its travel along said line.

4. A signal generator tunable through a wide range of frequencies comprising an oscillator for producing an electrical signal having output terminals and including a vacuum tube having a control electrode, an anode, and a cathode, and a tuning element in the tuning circuit of said oscillator comprising a rotor, a transmission line comprising two parallel wires wound on said rotor, a conductor for connecting points on said wires so as to provide a transmission line having opposite sides of equal length, said conductor being movable along said wires so as to vary the length of said line, conducting means associated with said conductor and movable into engagement with said transmission line for selectively connecting points on the opposite sides of said line whereby the opposite sides are of unequal length, and means for grounding said conductor for a portion of its travel along said line.

5. A signal generator capable of producing an electrical signal of predetermined frequency and tunable through a wide range of frequencies comprising an oscillator having output terminals and including a vacuum tube having a control electrode, an anode, and a cathode, a tuning element in the tuning circuit of said oscillator for determining the frequency of oscillation of said oscillator, and a variable attenuator connected to said output terminals, said tuning element comprising a rotor, a parallel transmission line helically wound on said rotor, a conductor having connecting points on the opposite sides of said line so as to provide a balanced transmission line, conducting means associated with said conductor and movable into engagement with one side of said transmission line for unbalancing said transmission line, means for rotating said rotor, means driven by the convolutions of said helically wound transmission line for moving said conductor along said line as said rotor is rotated to vary the length of said line, and means for grounding said conductor for a portion of its travel along said line.

6. A signal generator tunable through a wide range of frequencies comprising an oscillator having output terminals and including a vacuum tube having a control electrode, a plate and a cathode, a tuning element in the plate to grid circuit of said oscillator for determining the frequency of oscillation of said oscillator, and a variable attenuator connected to said output terminals, said tuning element comprising a rotor, a parallel wire transmission line helically wound on said rotor, a conductor having connecting points on the opposite sides of said line so as to provide a balanced transmission line, conducting means associated with said conductor and movable into engagement with one side of said transmission line for unbalancing said transmission line, means for rotating said rotor, means driven by the convolutions of said helically wound transmission line to move said conductor axially of said line as said rotor is rotated, and means for grounding said conductor through a portion of its travel along said line, the open end of one side of said line being connected to said plate, and the open end of the other side of said line being connected to said control element.

7. In a signal generator, an oscillator having a tuning circuit for determining its frequency of oscillation comprising a parallel wire transmission line and means for connecting opposite sides of said line and movable therealong to determine the effective length of the line, the last-said means including first electrically conducting means for terminating the line in a first condition of balance wherein the line is adapted to function in a first mode to determine the frequency of oscillation and means for terminating the line in a second condition of balance wherein said line is adapted to function in a second mode to determine the frequency of oscillation.

8. In a signal generator, an oscillator having a tuning circuit for determining its frequency of oscillation comprising a parallel wire transmission line and means for connecting opposite sides of said line and movable therealong to determine the effective length of the line, the last-said means including first electrically conducting means for terminating the line in a first condition of balance wherein the line is adapted to function in a first mode to determine the frequency of oscillation, means for terminating the line in a second condition of balance wherein said line is adapted to function in a second mode to determine the frequency of oscillation, and means for grounding said means for terminating said transmission line for at least a portion of its travel along the line.

9. In a signal generator, an oscillator having a tuning circuit for determining its frequency of oscillation comprising a parallel wire transmission line open at one end and electrically conducting means connected between opposite sides of the line and movable therealong to electrically terminate the line and determine its effective length, the last-said means including conducting means to selectively terminate said line in a substantially balanced condition wherein said line operates in a first mode to determine the frequency of oscillation of said oscillator and conducting means to selectively terminate said line in an unbalanced condition wherein said line operates in a second mode to determine the frequency of oscillation of said oscillator.

10. In a signal generator, an oscillator having a tuning circuit for determining its frequency of oscillation comprising a parallel wire transmission line open at one end and electrically conducting means connected between opposite sides of the line and movable therealong to terminate the line and determine its effective length, the last-said means including means to selectively terminate said line in a first condition of balance wherein said line operates as a ¼ wave length mode to determine the frequency of oscillation of said oscillator and means to selectively terminate said line in a second condition of balance wherein said line operates in a ¾ wave length mode to determine the frequency of oscillation of said oscillator, and means for grounding said electrically conducting means for at least a portion of its travel.

11. In a signal generator, an oscillator having a tuning circuit for determining its frequency of oscillation comprising a parallel wire transmission line open at one end and electrically conducting means movable along the line to electrically terminate the line at the other end and determine its effective length, said electrically conducting means including conducting means for connecting points on the opposite sides of said line equidistant from the open end to terminate said line in a first condition wherein said line operates in a first mode and conducting means for selectively connecting points on the opposite sides of said line of unequal distances from the open end of the line to terminate said line in a second condition of balance wherein the line operates in a second mode to determine the frequency of oscillation of said oscillator.

12. In a signal generator, an oscillator having a tuning circuit for determining its frequency of oscillation comprising a parallel wire transmission line open at one end and electrically conducting means movable along the line to electrically terminate the line at the other end and determine its effective length, said electrically conducting means including conducting means for connecting points on the opposite sides of said line equidistant from the open end to terminate said line in a first condition of balance wherein said line operates in a first mode to determine the frequency of oscillation of said oscillator and conducting means for selectively connecting points on the opposite sides of said line of unequal distances from the open end of the line to terminate said line in a second condition of balance wherein the line operates in a second mode to determine the frequency of oscillation of said oscillator, and means for grounding said electrically conducting means for at least a portion of its travel along said line.

13. In a signal generator, an oscillator having a tuning circuit for determining its frequency of oscillation comprising a coiled parallel wire transmission line, the opposite sides of the line forming the adjacent convolutions of the coil, and a member movable along the line for electrically terminating the line and for determining the effective length thereof, said member including means for connecting opposite sides of said line to selectively terminate said line in a first condition of balance wherein said line operates in a first mode and conducting means for connecting opposite sides of said line to selectively terminate said line in a second condition of balance wherein said line operates in a second mode to determine the frequency of oscillation.

14. In a signal generator, an oscillator having a tuning circuit for determining its frequency of oscillation comprising a helically coiled parallel wire transmission line, the opposite sides of the line forming the adjacent convolutions of the coil, and a member movable along the line for electrically terminating the line and for determining the effective length thereof, said member including means for connecting opposite sides of said line to selectively terminate said line in a first condition of balance wherein said line operates in a first mode and conducting means for connecting opposite sides of said line to selectively terminate said line in a second condition of balance wherein said line operates in a second mode to determine the frequency of oscillation, and means for grounding said member for at least a portion of its travel along said line.

15. In a signal generator an oscillator having a tuning circuit for determining its frequency of oscillation comprising a helically coiled parallel wire transmission line, the opposite sides of the line forming the adjacent convolutions of the coil, and a member movable along the line for electrically terminating the line and for determining the effective length thereof, said member having a pair of fingers adapted to engage opposite sides of said line and to connect substantially opposite points on said line to produce a particular condition of balance wherein said line functions in a first mode to determine the frequency of oscillation of the oscillator and a third finger adapted to engage one side of said line and adapted to cooperate with the finger of said pair of fingers engaging the other side of said line to terminate said line in a second condition of balance wherein the line functions in a second mode to determine the frequency of oscillation of said oscillator, and means for selectively engaging and disengaging one of said fingers engaging said one side of said line.

16. In a signal generator an oscillator having a tuning circuit for determining its frequency of oscillation comprising a helically coiled parallel wire transmission line, the opposite sides of the line forming the adjacent convolutions of the coil, and a member movable along the line for electrically terminating the line and for determining the effective length thereof, said member having a pair of fingers adapted to engage opposite sides of said line and to connect substantially opposite points on said line to produce a particular condition of balance wherein said line functions in a first mode to determine the frequency of oscillation and a third finger adapted to engage one side of said line and adapted to cooperate with the finger of said pair of fingers engaging the other side of said line to terminate said line in a second condition of balance wherein the line functions in a second mode to determine the frequency of oscillation of said oscillator, means for selectively engaging and disengaging one of said fingers engaging said one side of said line, and means for grounding said member for at least a portion of its travel along said line.

17. A signal generator comprising an oscillator for producing an electrical signal including a vacuum tube having an anode, a cathode, and a control element; and tuning means connected to said tube for controlling the frequency of oscillation of said oscillator comprising a helically coiled transmission line, the adjacent convolutions of the coil being formed by opposite sides of the line, short-circuiting means movable along the convolutions of said coil for electrically terminating said line and determining the frequency of oscillation of said oscillator, said member having a pair of fingers for engaging the opposite sides of said line to terminate said line with opposite sides of substantially equal length whereby said line is adapted to function as a ¼ wave length line and a third finger connected to said member for engaging one side of said line for terminating the said line with opposite sides of unequal length whereby said line is adapted to function as a ¾ wave length line, means for selectively engaging and disengaging one of said fingers engaging said one side of said line to determine the mode in which said transmission line operates, and means for grounding said member for at least a portion of its travel along said line.

References Cited in the file of this patent

UNITED STATES PATENTS

| | | |
|---|---|---|
| 1,911,980 | Vance | May 30, 1933 |
| 2,599,126 | Reed | June 3, 1952 |

FOREIGN PATENTS

| | | |
|---|---|---|
| 375,698 | Great Britain | June 30, 1932 |